(12) United States Patent
Maeda

(10) Patent No.: US 6,576,940 B2
(45) Date of Patent: Jun. 10, 2003

(54) SEMICONDUCTOR DEVICE HAVING A SOLID STATE IMAGE SENSING DEVICE AND MANUFACTURING METHOD THEREOF

(75) Inventor: Atsushi Maeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/768,233

(22) Filed: Jan. 25, 2001

(65) Prior Publication Data

US 2002/0009824 A1 Jan. 24, 2002

(30) Foreign Application Priority Data

Jul. 21, 2000 (JP) ........................................ 2000-220269

(51) Int. Cl.⁷ ............................................. H01L 21/336
(52) U.S. Cl. ...................... 257/292; 257/446; 257/452; 250/208.1; 250/214.1
(58) Field of Search .............................. 257/291–3, 436, 257/443, 445–6, 452, 327–8, 338–9, 345, 262, 350; 438/227, 298, FOR 161, FOR 168, FOR 314; 250/208.1, 214.1

(56) References Cited

U.S. PATENT DOCUMENTS

| | | | | |
|---|---|---|---|---|
| 4,325,180 A | * | 4/1982 | Curran | 257/262 |
| 5,814,866 A | * | 9/1998 | Borland | 257/350 |
| 5,898,196 A | | 4/1999 | Hook et al. | |
| 6,476,371 B2 | * | 11/2002 | Miida | 250/208.1 |

FOREIGN PATENT DOCUMENTS

JP          2000-77647          3/2000

* cited by examiner

*Primary Examiner*—George Fourson
*Assistant Examiner*—Thanh V Pham
(74) *Attorney, Agent, or Firm*—McDermott, Will & Emery

(57) ABSTRACT

In a semiconductor device having a solid state image sensing device of the present invention, a p-type well region 2a in which a plurality of unit cells, each having a photodiode PD, are formed and a p-type well region 2b in which a peripheral circuit element is formed are installed in a separated manner. Thus, it is possible to prevent a hot carrier, transition metals, etc. within the peripheral circuit region from invading the pixel region more effectively. Consequently, it becomes possible to provide a semiconductor device having a solid state image sensing device and a manufacturing method thereof, which can improve the pixel characteristic.

6 Claims, 23 Drawing Sheets

PERIPHERAL CIRCUIT REGION

PIXEL REGION

SEMICONDUCTOR DEVICE HAVING A SOLID STATE IMAGE SENSING DEVICE AND MANUFACTURING METHOD THEREOF

BACKGROUND OF THE INVENTION

1. Field of the Invention

The present invention relates to a semiconductor device having a solid state image sensing device and a manufacturing method thereof.

2. Description of the Background Art

In recent years, a solid state image sensing device using an amplification-type sensor has been proposed as one type of solid state image sensing devices. This device features that a light signal detected by a photoelectric transfer storage section is amplified in the proximity of the photoelectric transfer storage section.

FIG. 22 is a drawing that shows a circuit construction of a CMOS-type (Complementary Metal Oxide Semiconductor) image sensor serving as a solid state image sensing device. As illustrated in FIG. 22, unit pixels or unit cells C are arranged in a matrix format, and each of the cells C is connected to a vertical shift register and a horizontal shift register.

Each of the unit cells C has a photodiode PD, a transfer switch M1, a reset switch M2, an amplifier M3 and a selection switch M4. The photodiode PD transfers incident light to an electric signal. The transfer switch M1, which is controlled by a signal sent from the vertical shift register, transfers the electric signal thus transferred to the amplifier M3. The reset switch M2 resets a signal charge, and the amplifier M3 amplifies the electric signal.

Here, the transfer switch M1, the reset switch M2, the amplifier M3 and the selection switch M4 are respectively constituted by MOS transistors.

For example, U.S. Pat. No. 5,898,196 discloses a specific construction of such a solid state image sensing device.

FIG. 23 is a schematic cross-sectional view that shows the construction of a semiconductor device having the solid state image sensing device disclosed in U.S. Pat. No. 5,898,196. As illustrated in FIG. 23, a photodiode PD and a transfer switch M1 constituting the solid state image sensing device are shown in a pixel region, and a transistor Tn, etc. constituting peripheral circuits such as vertical and horizontal shift registers are shown in a logic region.

A p$^-$ impurity region 102 and p$^+$ impurity region 102a are formed on a p$^+$ region 101, and both of the solid state image sensing device and the peripheral circuit device are formed in the p$^-$ impurity region 102.

The photodiode PD in the pixel region is constituted by the p$^-$ impurity region 102 and an n$^-$ impurity region 104. A p$^+$ impurity region 105 is formed on the upper portion of the n$^-$ impurity region 104.

The transfer switch M1 is provided with an n$^-$ source region 104, an n$^+$ drain (FD) region 106 and a gate electrode layer 108. The n$^-$ source region 104 and the n$^+$ drain region 106 are formed with a predetermined distance. The gate electrode layer 108 is formed on an region sandwiched by the n$^-$ source region 104 and the n$^+$ drain region 106 through a gate insulation layer 107. Here, the n$^-$ impurity region 104 of the photodiode PD and the n$^-$ source region 104 of the transfer switch M1 are constituted by the same impurity region.

The MOS transistor Tn in the logic region is provided with a pair of n$^+$ source/drain regions 122 and a gate electrode layer 124. The pair of n$^+$ source/drain regions are formed with a predetermined distance in between. The gate electrode layer 124 is formed on an region sandwiched by the pair of n$^+$ source/drain regions through a gate insulation layer 123.

The pixel region and the logic region are electrically separated by a separation region 103 formed on the surface of the semiconductor substrate 101.

In the above-mentioned construction of FIG. 23, the p$^-$ impurity region 102 in which the pixel cell is formed and the p$^-$ impurity region 102 in which the peripheral circuit element is formed are integrally formed. This construction has raised a problem of degradation in the pixel characteristic (SIN ratio) of the pixel cell. A detailed explanation will be given of this problem.

As illustrated in FIG. 23, in the MOS transistor Tn of the logic region, when the gate length (that is, the channel length) is shortened with the voltage between the drain and source being constant, the electric field inside a void layer located at a drain end portion of a channel becomes extremely great. As a result, an avalanche phenomenon in which electrons are accelerated to high speeds, and collide with atoms to generate electrons and positive holes in a manner like an avalanche takes place. One portion of a charge such as a hot carrier caused by this phenomenon is dispersed inside the p$^-$ impurity region 102. At this time, in the case when the p$^-$ impurity regions 102 of the pixel region and the logic region are integrally formed, the charge such as a hot carrier easily invade the pixel region. As a result, the charge such as a hot carrier forms a noise component, thereby causing degradation in the pixel characteristic (SIN ratio).

Here, supposing that the generation of charge in the photodiode PD portion is $Q_P$ and the capacity in the FD portion is $C_{FD}$, the output voltage Vout is represented by Vout=$Q_P/C_{FD}$.

When the above-mentioned noise component $Q_1$ exists, the corresponding error $\Delta$Vout=$Q_1/F_{FD}$ is generated. Consequently, in the case of no light irradiation, Vout (noise) is increased by the value corresponding to $\Delta$Vout, with the result that the sensitivity as the solid state image sensing device, that is, the S/N ratio, is lowered.

Moreover, at the time when the substrate is transported or when the substrate is wet-etched, transition metals, such as Cr, Fe, Ni, Co, etc., or heavy metals such as Cu, Au, etc., tend to adhere to the vicinity of the surface of the substrate, or minute defects such as deposition of oxides tend to be produced. In this case, these transition metals, heavy metals, minute defects, etc. easily invade from the logic region to the pixel region, causing a leak current and resulting in degradation in the pixel characteristic (S/N ratio).

SUMMARY OF THE INVENTION

The present invention has been devised to solve the above-mentioned problems, and its objective is to provide a semiconductor device having a solid state image sensing device and a manufacturing method thereof, which can improve the pixel characteristic by preventing a hot carrier, transition metals, etc. from invading from a peripheral circuit region to a pixel region.

The semiconductor device having a solid state image sensing device of the present invention is provided with a semiconductor substrate, first and second well regions, a plurality of unit cells and a peripheral circuit element. The semiconductor substrate is a first conductive type, and has a main surface. The first and second well regions are a second conductive type, and formed on the main surface of the semiconductor substrate. Each of the unit cells is formed on the first well region, and is provided with a photoelectric transfer element for transferring light to an electric signal. The peripheral circuit element, which is formed on the second well region, is used for controlling the unit cells. The first well region is surrounded by a region of the first conductive type on the periphery thereof so as to be separated from the second well region.

In accordance with the semiconductor device having a solid state image sensing device of the present invention, the first well region in which a plurality of unit cells are formed and the second well region in which a peripheral circuit element is formed are separated from each other; therefore, it is possible to limit a hot carrier caused in the peripheral circuit element from invading the first well region. Moreover, it is also possible to limit transition metals, heavy metals and minute defects in the second well region from invading the first well region. For this reason, it is possible to reduce noise components from the photoelectric transfer element as compared with conventional devices, and consequently to improve the pixel characteristic (S/N ratio).

In the above-mentioned semiconductor device having a solid state image sensing device, it is preferable to form a gettering layer below the first well region.

With this arrangement, transition metals, heavy metals and minute defects in the first well region and transition metals, heavy metals and minute defects dispersed toward the first well region side are taken into the gettering layer so that it is possible to further improve the pixel characteristic (S/N ratio).

In the above-mentioned semiconductor device having a solid state image sensing device, it is preferable to provide the gettering layer of the first conductive type, which has an impurity concentration higher than the impurity concentration of the semiconductor substrate.

The presence of the high-concentration gettering layer makes it possible to reduce the resistance of the substrate portion, and consequently to reduce the occurrence of latch-up that tends to raise problems in the CMOS construction. Moreover, it is possible to limit a charge such as a hot carrier generated in the peripheral circuit element from dispersing to the first well region side, and consequently to further improve the pixel characteristic (S/N ratio).

In the above-mentioned semiconductor device having a solid state image sensing device, it is preferable to provide the gettering layer of the second conductive type, which has an impurity concentration higher than the impurity concentration of the first well region.

The presence of the high-concentration gettering layer makes it possible to reduce the resistance of the substrate portion, and consequently to reduce the occurrence of latch-up that tends to raise problems in the CMOS construction. Moreover, it is possible to limit a charge such as a hot carrier generated in the peripheral circuit element from dispersing to the first well region side, and consequently to further improve the pixel characteristic (S/N ratio).

In the above-mentioned semiconductor device having a solid state image sensing device, it is preferable to provide a first separating impurity region of the first conductive type, which surrounds a side portion of the first well region, and has an impurity concentration higher than the impurity concentration of the semiconductor substrate.

This arrangement forms the first separating impurity region having a high concentration interpolated between the first well region and the second well region. For this reason, it is possible to prevent a charge such as a hot carrier, transition metals, etc. within the second well region from invading the first well region more effectively. Therefore, it is possible to reduce the leak current, to prevent reduction in the sensitivity, and to improve resistance to latch-up.

In the above-mentioned semiconductor device having a solid state image sensing device, it is preferable to further provide a second separating impurity region of the first conductive type, which is formed below the first well region, and has an impurity concentration higher than the impurity concentration of the semiconductor substrate.

The presence of this high-concentration second separating impurity region makes it possible to reduce the resistance of the substrate portion, and consequently to reduce the occurrence of latch-up that tends to raise problems in the CMOS construction. Moreover, it is possible to limit a charge such as a hot carrier generated in the peripheral circuit element from dispersing to the first well region side, and consequently to further improve the pixel characteristic (S/N ratio).

The manufacturing method of a semiconductor device having a solid state image sensing device of the present invention is provided with the following processes.

First, an impurity of the second conductive type is injected to the main surface of a semiconductor substrate of the first conductive type so that the first and second well regions of the second conductive type that are separated from each other are formed. Then, a plurality of unit cells each of which has a photoelectric transfer element for transferring light to an electric signal are formed in the first well region. Further, a peripheral circuit element for controlling the unit cells is formed in the second well region.

In the manufacturing method of the semiconductor device having a solid state image sensing device of the present invention, the first well region in which the unit cells are formed and the second well region in which the peripheral circuit element is formed are formed in a separate manner from each other; thus, it is possible to limit a hot carrier generated in the peripheral circuit element from invading the first well region. Moreover, it is also possible to limit transition metals, heavy metals and minute defects in the second well region from invading the first well region. For this reason, it is possible to reduce noise components from the photoelectric transfer element as compared with conventional devices, and consequently to improve the pixel characteristic (S/N ratio).

In the above-mentioned manufacturing method of a semiconductor device having a solid state image sensing device, it is preferable to further provide a process for forming a gettering layer below the first well region.

With this arrangement, transition metals, heavy metals and minute defects in the first well region and transition metals, heavy metals and minute defects dispersed toward the first well region side are taken into the gettering layer so that it is possible to further improve the pixel characteristic (S/N ratio).

In the above-mentioned manufacturing method of a semiconductor device having a solid state image sensing device, the gettering layer is preferably formed by exposing a semiconductor substrate to a heated gas so as to inject an impurity into the semiconductor substrate.

This makes it possible to easily form the gettering layer.

In the above-mentioned manufacturing method of a semiconductor device having a solid state image sensing device, the gettering layer is preferably formed by ion-injecting an impurity to a semiconductor substrate prior to forming the first and second well regions.

By using the ion-injecting method, it is possible to easily form the gettering layer with a high controlling property.

In the above-mentioned manufacturing method of a semiconductor device having a solid state image sensing device, the gettering layer is preferably formed by ion-injecting an impurity to a semiconductor substrate after forming the first and second well regions.

In this manner, by using the ion-injecting method, it is possible to form the gettering layer after forming the first and second well regions.

In the above-mentioned manufacturing method of a semiconductor device having a solid state image sensing device, it is preferable to further provide a process for forming a separating impurity region of the first conductive type, which surrounds a side portion of the first well region, and has an impurity concentration higher than the impurity concentration of the semiconductor substrate.

This process provides the separating impurity region having a high concentration interpolated between the first well region and the second well region. For this reason, it is possible to prevent a charge such as a hot carrier, transition metals, etc. within the second well region from invading the first well region more effectively. Therefore, it is possible to reduce the leak current, to prevent reduction in the sensitivity, and to improve resistance to latch-up.

In the above-mentioned manufacturing method of a semiconductor device having a solid state image sensing device, the separating impurity region is preferably formed by exposing a semiconductor substrate to a heated gas so as to inject an impurity into the semiconductor substrate.

This makes it possible to easily form the separating impurity region.

In the above-mentioned manufacturing method of a semiconductor device having a solid state image sensing device, the separating impurity region is preferably formed by ion-injecting an impurity to a semiconductor substrate.

By using the ion-injecting method, it is possible to easily form the separating impurity region with a high controlling property.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
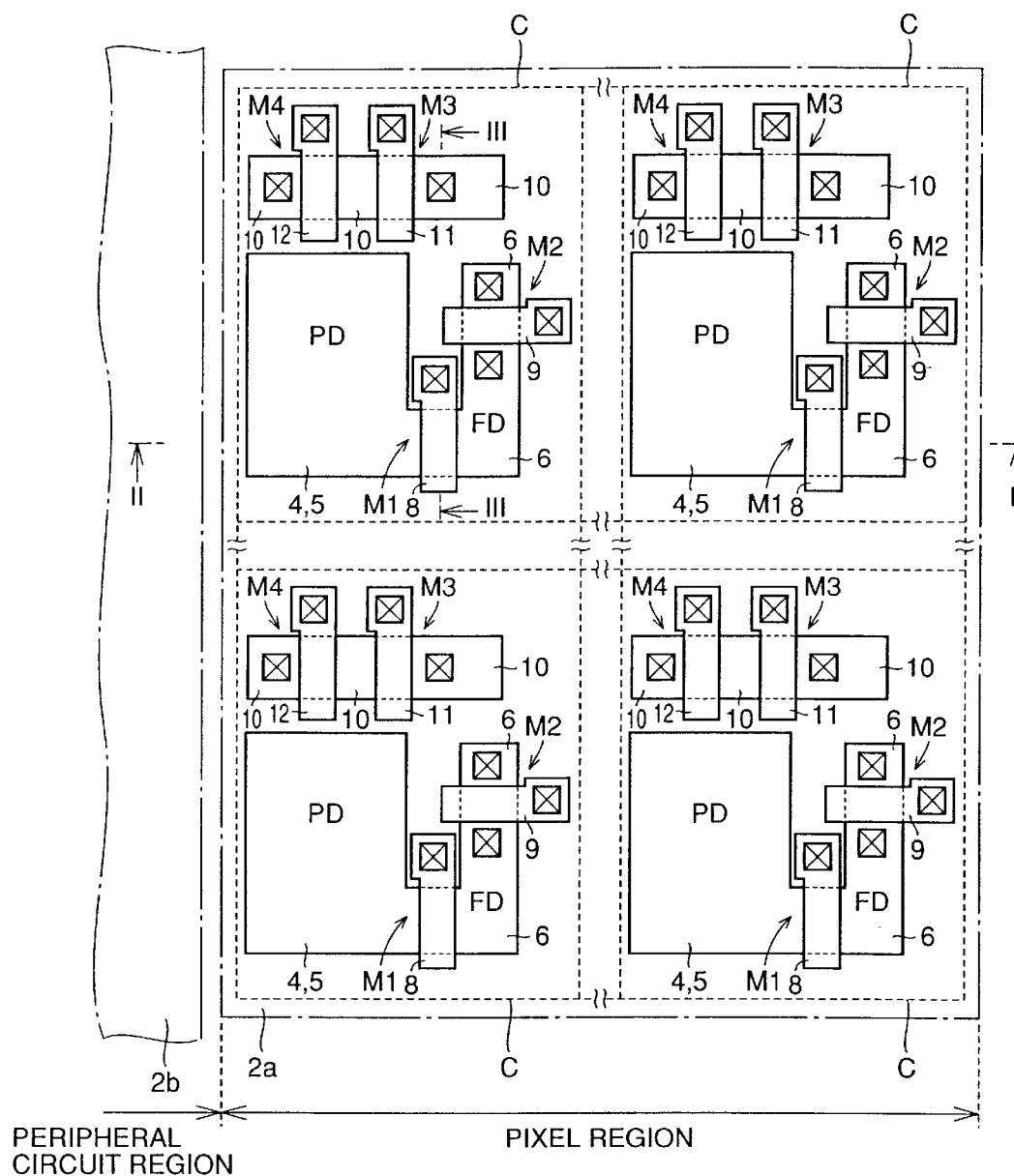
FIG. 1 is a plan view that schematically shows the structure of a semiconductor device having a solid state image sensing device in accordance with First Embodiment of the present invention.

As illustrated in FIG. 1, on the surface of a semiconductor substrate 1, a pixel region and a peripheral circuit region are placed. In the pixel region, a plurality of unit cells C are formed in a matrix format, and in the peripheral circuit region, a peripheral circuit including a vertical shift register and a horizontal shift register for controlling the unit cells C is formed.

Each of the unit cells C in the pixel region is provided a photodiode PD, a transfer switch M1, a reset switch M2, an amplifier M3 and a selection switch M4.

The unit cells C are formed in a p-type well region (p-type impurity region) 2a on the surface of a silicon substrate 1. Moreover, peripheral circuit elements are formed within a p-type well region (p-type impurity region) 2b, etc., on the surface of the semiconductor substrate 1. The p-type well region 2a is surrounded by an n-type region of the silicon substrate 1 on the periphery thereof so that it is separated from the other p-type well region 2b, etc. Thus, only the unit cells C are formed within the p-type well region 2a.

Figure 2:
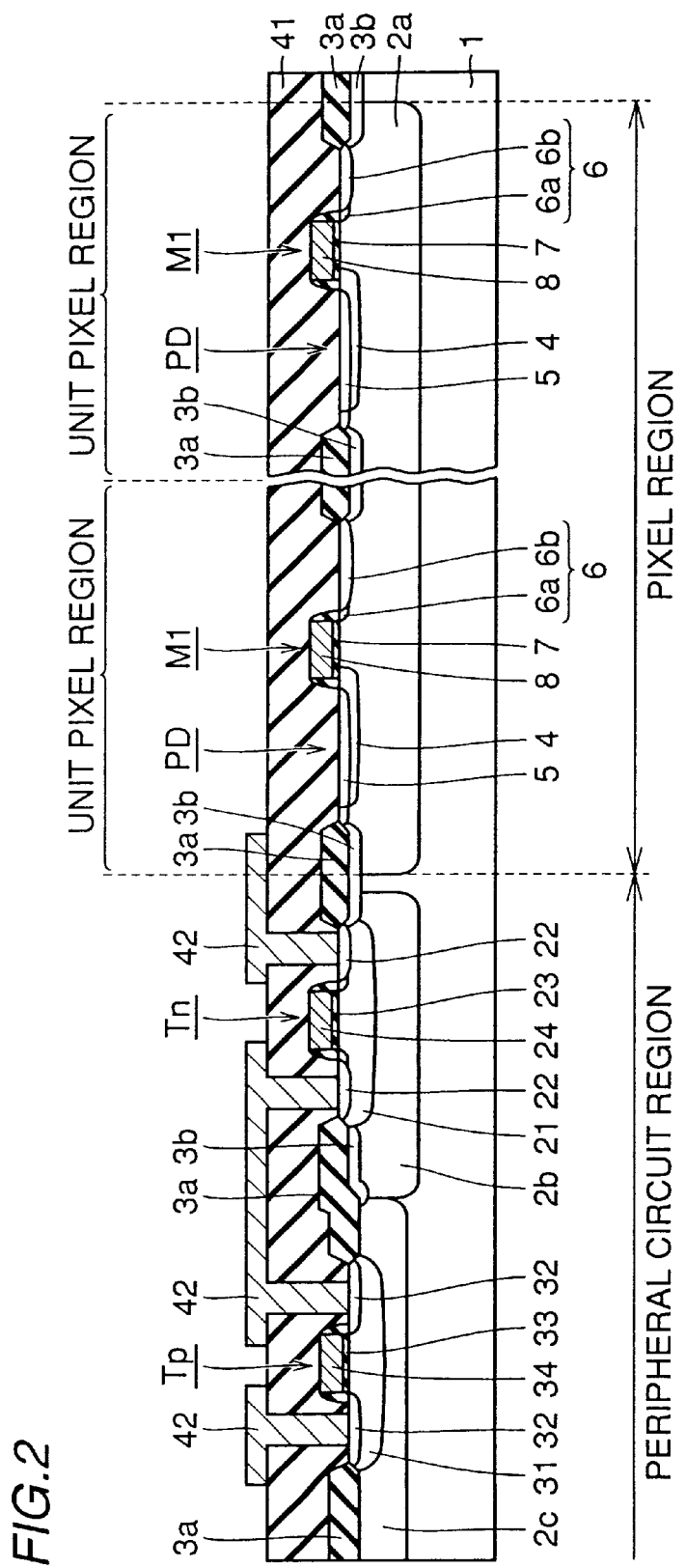
FIG. 2 is a schematic cross-sectional view taken along line II—II in FIG. 1.

As illustrated in FIG. 2, the photodiode PD is constituted by the pn junction of the p-type well region 2a and an n-type impurity region 4. A p-type impurity region 5 is formed on the upper portion of the n-type impurity region 4. This p-type impurity region 5 is formed with such a concentration that a void layer of the pn junction of the p-type well region 2a and the n-type impurity region 4 is not allowed to reach the surface of the semiconductor substrate 1. The p-type impurity region 5 prevents defects, etc. existing in the vicinity of the surface of the semiconductor substrate 1 from being taken into the void layer, thereby making it possible to regulate the resulting dark current.

The transfer switch M1 is provided with an n-type source region 4, an n-type drain (FD) region 6, and a gate electrode layer 8. The n-type source region 4 and the n-type drain region 6 are formed on the surface of the semiconductor substrate 1 in a separated manner with a predetermined distance. The gate electrode layer 8a is formed on a region sandwiched by the n-type source region 4 and the n-type drain region 6 through a gate insulation layer 7.

Here, the n-type drain region 6 has a LDD (Lightly Doped Drain) structure consisting of a comparatively low-concentration region 6a and a comparatively high-concentration region 6b. Moreover, the n-type source region 4 of the transfer switch M1 and the n-type impurity region 4 of the photodiode PD are constituted by the same impurity region.

As illustrated in FIG. 1, the reset switch M2 has a pair of n-type source/drain regions 6 and a gate electrode layer 9. The pair of n-type source/drain regions 6 are formed on the surface of the semiconductor substrate 1 in a separated manner with a predetermined distance. The gate electrode layer 9 is formed on a region sandwiched by a pair of n-type source/drain regions 6 through a gate electrode layer (not shown).

Here, the n-type drain region 6 of the transfer switch M1 and one of the pair of source/drain regions 6 of the reset switch M2 are constituted by the same impurity region.

The amplifier M3 is provided with a pair of n-type source/drain regions 10 and a gate electrode layer 11. The pair of n-type source/drain regions 10 are formed on the surface of the semiconductor substrate 1 in a separated manner with a predetermined distance. The gate electrode layer 11 is formed on a region sandwiched by the pair of source/drain regions 10 through a gate electrode layer (not shown).

The selection switch M4 is provided with a pair of n-type source/drain regions 10 and a gate electrode layer 12. The pair of n-type source/drain regions 10 are formed on the surface of the semiconductor substrate 1 in a separated manner with a predetermined distance. The gate electrode layer 12 is formed on a region sandwiched by the pair of source/drain regions 10 through a gate insulation layer (not shown).

Here, one of the n-type source/drain regions 10 of the amplifier M3 and one of the n-type source/drain regions 10 of the selection switch M4 are constituted by the same impurity region.

As illustrated in FIG. 2, for example, an n-MOS transistor Tn, a p-MOS transistor Tp, etc. are formed in the peripheral circuit region. The n-MOS transistor Tn is provided with a pair of n-type source/drain regions 22 and a gate electrode layer 24 formed on an region sandwiched by the pair of source/drain regions 22 through a gate insulation layer 23.

Moreover, the p-MOS transistor Tp is provided with a pair of p-type source/drain regions 32 and a gate electrode layer 34 formed on an region sandwiched by the pair of p-type source/drain regions 32 through a gate insulation layer 33.

The n-MOS transistor Tn is formed in the p-type well region 2b formed on the surface of the semiconductor substrate 1, and in the p-type well region 2b, a channel dope region 21 for controlling the concentration of the channel of the n-MOS transistor Tn is also formed. Moreover, the p-MOS transistor Tp is formed in the n-type well region 2c, and in the n-type well region 2c, a channel dope region 31 for controlling the concentration of the channel of the p-MOS transistor Tp is also formed.

Figure 3:
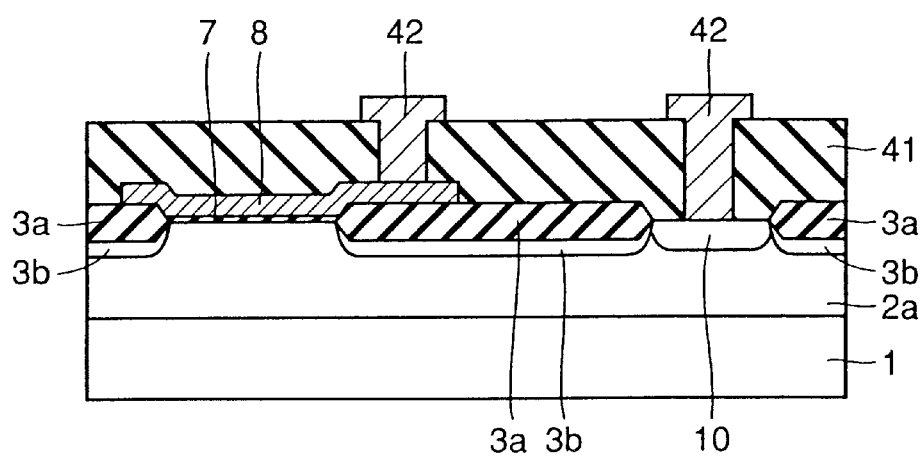
FIG. 3 is a schematic cross-sectional view taken along line III—III in FIG. 1.

As illustrated in FIGS. 2 and 3, in order to electrically separate the respective elements, a field oxide film 3a and a separating impurity region 3b are formed on the surface of the semiconductor substrate 1. An interlayer insulation layer 41 is formed in a manner so as to cover the respective elements. Moreover, a wiring layer 42 which is electrically connected to the conductive regions of the respective elements is formed on the interlayer insulation layer 41 through patterning.

Next, an explanation will be given of a manufacturing method of the semiconductor device having a solid state image sensing device of the present embodiment.

Figure 4:
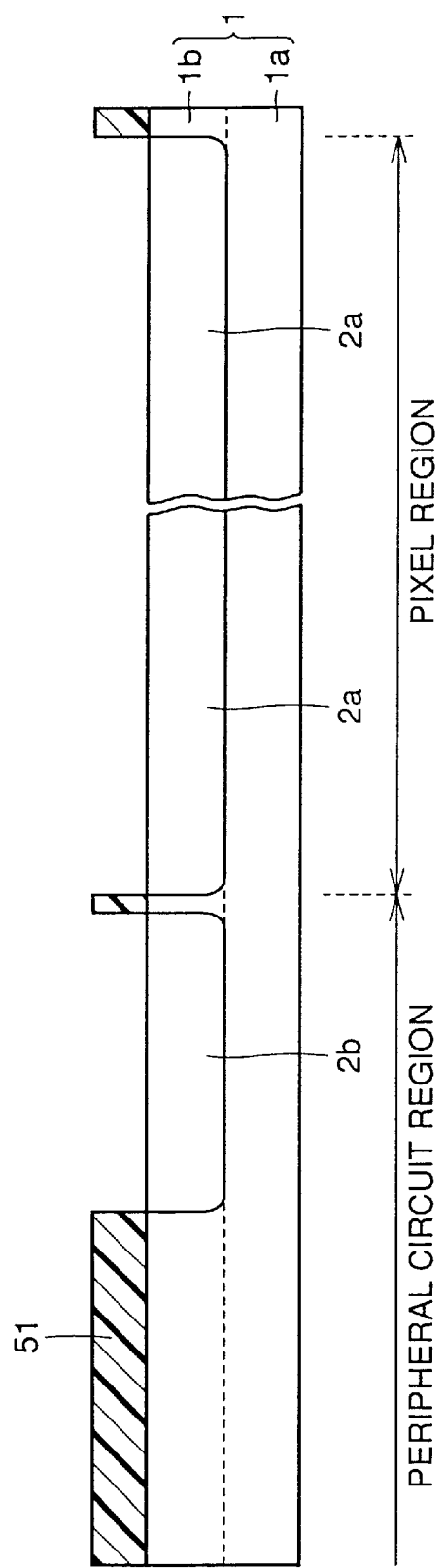
FIGS. 4 to 6 are schematic cross-sectional views that show a sequence of processes of a manufacturing method of the semiconductor device having a solid state image sensing device of First Embodiment of the present invention.

As illustrated in FIG. 4, a silicon single crystal 1b is formed through epitaxial growth on an n-type silicon substrate 1a. On the surface of the semiconductor substrate 1 thus formed, a pattern of photoresist 51 is formed by using a normal photolithography technique. A p-type impurity is ion-injected to the surface of the semiconductor substrate 1 by using the resist pattern 51 as a mask so that p-type well regions 2a and 2b, separated from each other, are formed. Thereafter, the resist pattern 51 is removed.

Figure 5:
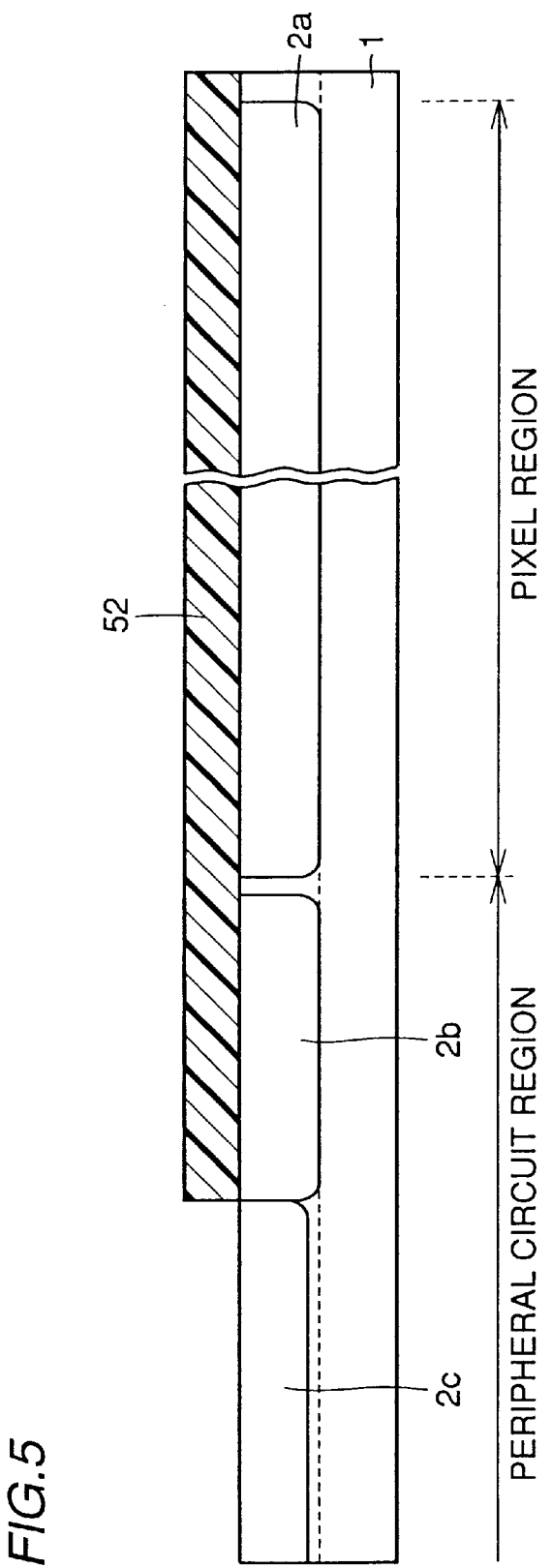

As illustrated in FIG. 5, on the surface of the semiconductor substrate 1, a pattern of photoresist 52 is formed by using a normal photolithography technique. An n-type impurity is ion-injected to the surface of the semiconductor substrate 1 by using the resist pattern 52 as a mask so that an n-type well region 2c is formed. Thereafter, the resist pattern 52 is removed.

Figure 6:
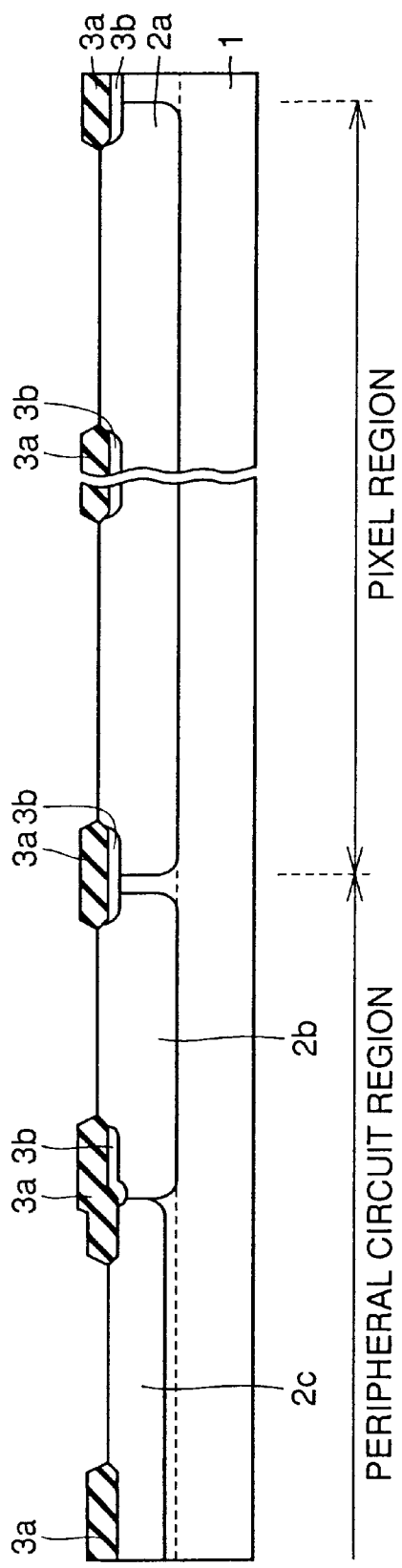

As illustrated in FIG. 6, a field oxide film 3a is formed through a normal LOCOS (Local Oxidation of Silicon) method, and a separating $p^+$ impurity region 3b is formed in a manner so as to contact the lower surface of the field oxide film 3a.

Thereafter, a solid state image sensing device, peripheral circuit element, etc. are formed so that a semiconductor device having a solid state image sensing device, shown in FIG. 2, is completed.

In the present embodiment, as illustrated in FIG. 1 and FIG. 2, the p-type well region 2a of a pixel region is surrounded by the n-type region on the periphery thereof so as to be separated from the p-type well region 2b in the peripheral circuit region. For this reason, it is possible to regulate a hot carrier generated in the peripheral circuit element from invading the p-type well region 2a within the pixel region from the p-type well region 2b. Moreover, it is possible to prevent transition metals, heavy metals, minute defects, etc. existing in the peripheral circuit region from invading the p-type well region 2a within the pixel region. Thus, it becomes possible to reduce noise components from the photoelectric transfer element (photodiode PD) as compared with conventional devices, and consequently to improve the pixel characteristic (S/N ratio).

(Second Embodiment)

Figure 7:
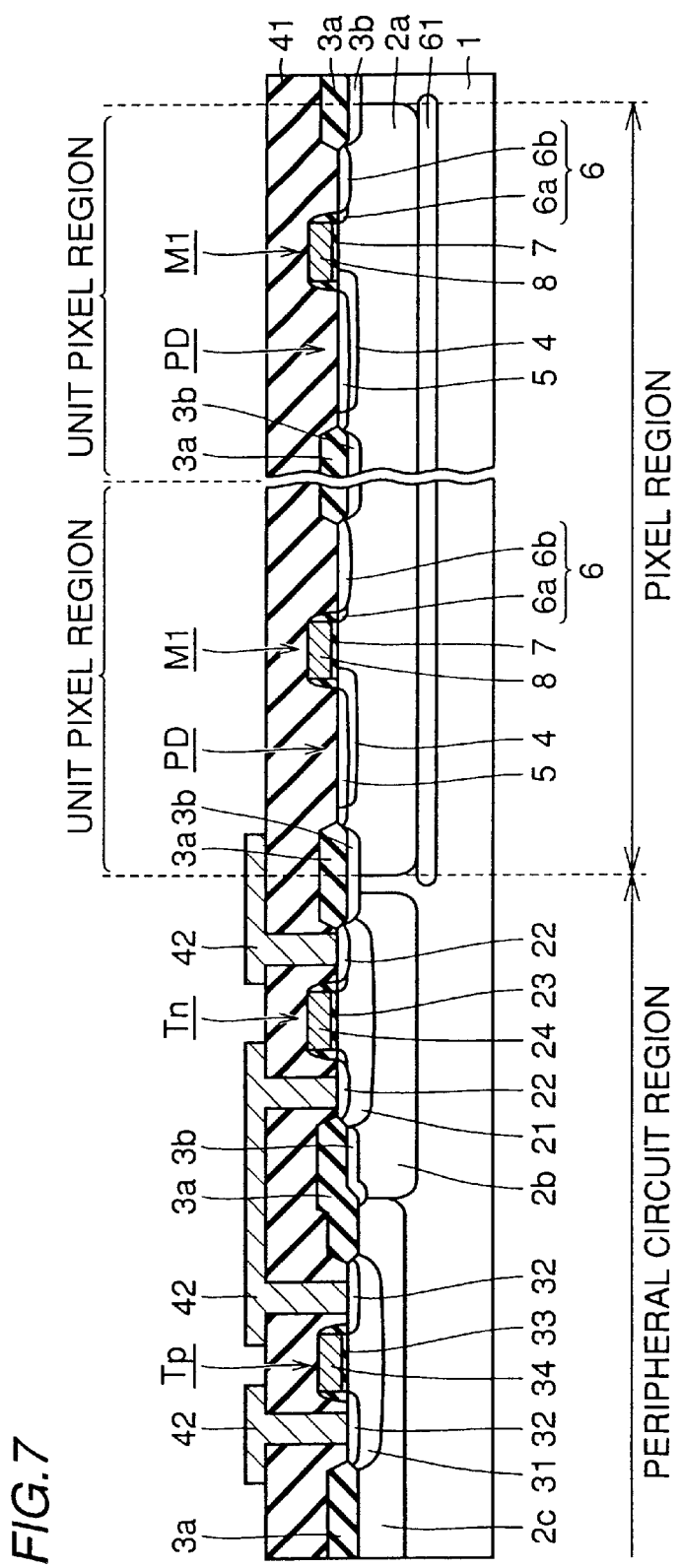
FIG. 7 is a cross-sectional view that schematically shows the structure of a semiconductor device having a solid state image sensing device in accordance with Second Embodiment of the present invention.

As illustrated in FIG. 7, the construction of the present embodiment is different from the construction of First Embodiment shown in FIG. 2 in that a gettering layer 61 is added. This gettering layer 61 is formed so as to contact the lower side of the p-type well region 2a in the pixel region. The gettering layer 61 is an impurity region which is doped, for example, with 19 phosphorus (P) at a high concentration (approximately, $10^{18}$ to 10 ions/cm$^{-3}$), and has an impurity concentration higher than the n-type impurity concentration ($10^{15}$ to $10^{16}$ ions/cm$^{-3}$) of the semiconductor substrate 1. This gettering layer 61 is preferably formed on the entire lower side of the p-type well region 2a; however, it may be formed on only one portion of the lower side of the p-type well region 2a.

Here, the other construction is virtually the same as the construction of First Embodiment, and the same members are represented by the same reference numbers; and the description thereof will be omitted.

Next, an explanation will be given of the manufacturing method of the semiconductor device having a solid state image sensing device of the present embodiment.

Figure 8:
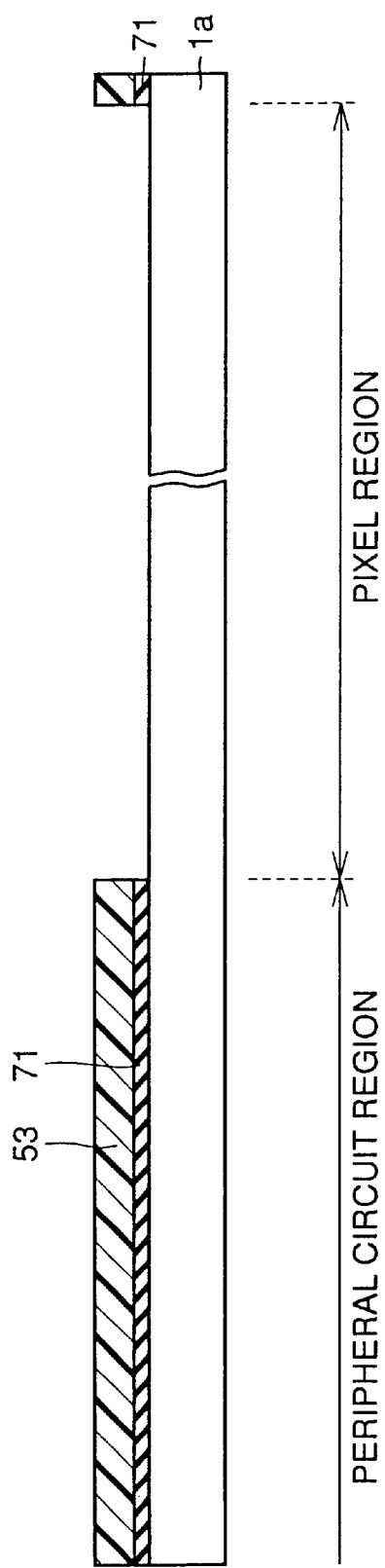
FIGS. 8 to 11 are schematic cross-sectional views that show a sequence of processes of a manufacturing method of the semiconductor device having a solid state image sensing device of Second Embodiment of the present invention.

As illustrated in FIG. 8, a silicon oxide film 71 is formed on the n-type silicon substrate 1a with a thickness of approximately 100 nm. On this silicon oxide film 71, a resist pattern 53 is formed by using a normal photolithography technique. The silicon oxide film 71 within the pixel region is selectively removed by using the resist pattern 53 as a mask, for example, by etching. Thereafter, the resist pattern 53 is removed.

Figure 9:
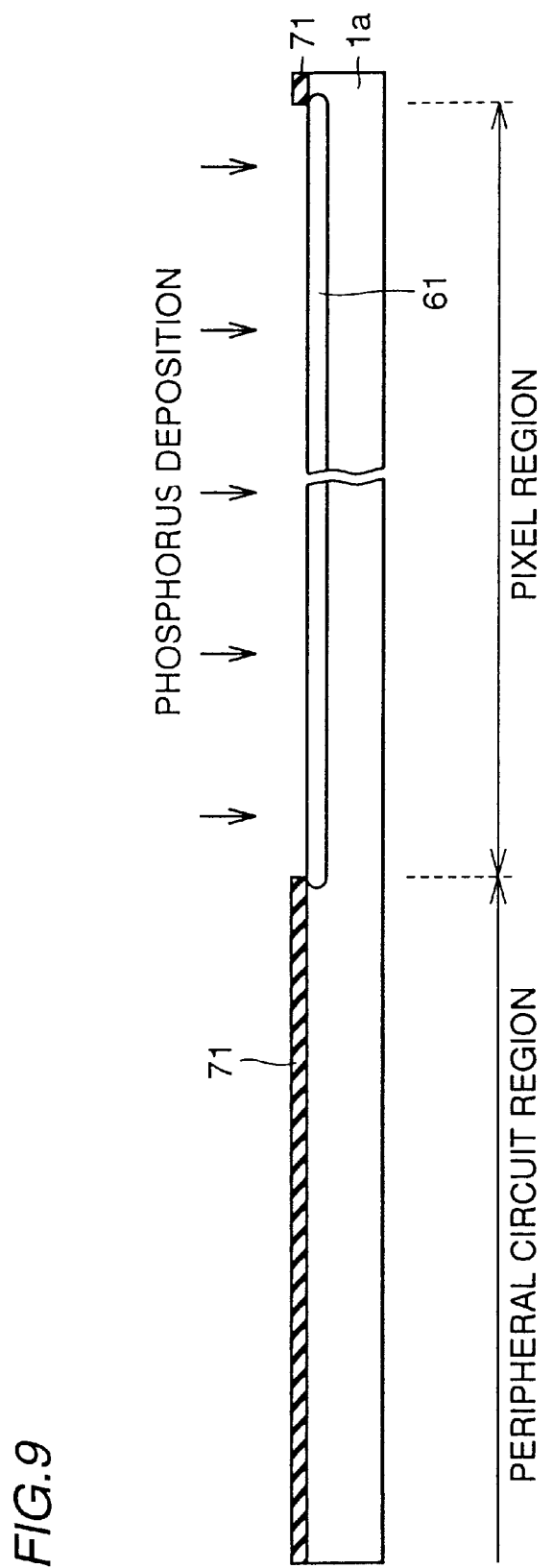

As illustrated in FIG. 9, the n-type silicon substrate 1a is exposed to a gaseous atmosphere in which, for example, a gas such as $POCl_3$ is thermally decomposed at a temperature of approximately 850 to 900° C. Thus, phosphorus is deposited on the surface exposed from the silicon oxide film 71 of the n-type silicon substrate 1a so that a gettering layer 61 that is a dispersed region of phosphorus is formed. Thereafter, the silicon oxide film 71 is removed.

Figure 10:
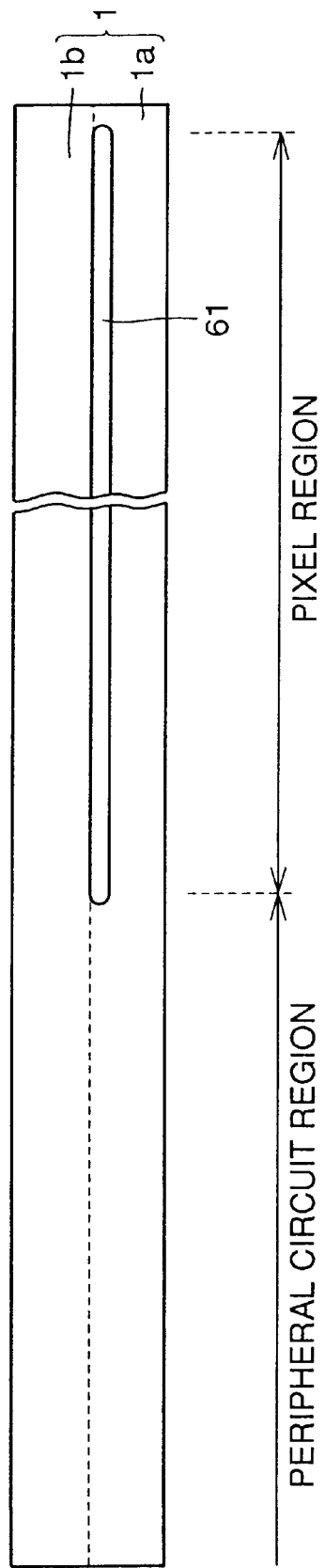

As illustrated in FIG. 10, a silicon single crystal 1b is formed through epitaxial growth on the entire surface of an n-type silicon substrate 1a. Thus, a semiconductor substrate 1 is formed by the silicon substrate 1a and the silicon single crystal 1b.

Figure 11:
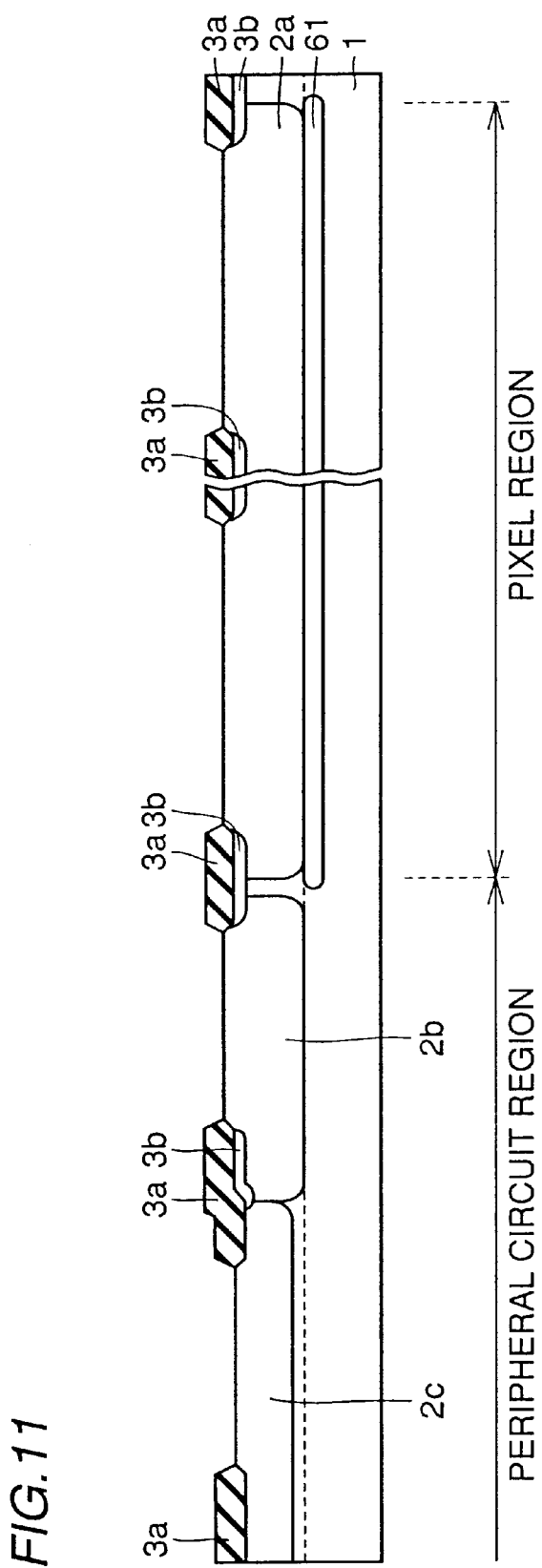

As illustrated in FIG. 11, through the same processes as those of First Embodiment shown in FIGS. 4 and 5, p-type well regions 2a and 2b and n-type well region 2c are formed. Thereafter, a field oxide film 3a is formed on the surface of the semiconductor substrate 1 through a normal LOCOS method, and a separating $p^+$ impurity region 3b is formed in a manner so as to contact the lower face of the field oxide film 3a.

Thereafter, a solid state image sensing device, peripheral circuit element, etc. are formed so that a semiconductor device having a solid state image sensing device, shown in FIG. 7, is completed.

In the present embodiment, the gettering layer 61 is formed below the p-type well region 2a. Phosphorus contained in the gettering layer 61 has such an effect (gettering effect) that impurities such as heavy metal elements, and minute defects in the silicon are taken therein. For this reason, impurities such as heavy metal elements and minute defects dispersed from the peripheral circuit region are taken in the gettering layer 61 so that it is possible to prevent these impurities and defects from invading to the p-type well region 2a. Moreover, impurities such as heavy metal elements and minute defects within the p-type well region 2a are also taken in the gettering layer 61. Therefore, since a leak current in the pixel region can be reduced, it becomes possible to reduce noise and also to improve the pixel characteristic (S/N ratio).

Moreover, since the gettering layer 61 is an impurity region with a high concentration, the presence the gettering layer makes it possible to reduce the resistance of the semiconductor substrate 1 portion, and consequently to reduce the occurrence of latch-up that tends to raise problems in the CMOS construction.

Moreover, since the gettering layer 61 is a high-concentration impurity region, it can also take in a charge such as a hot carrier generated in the peripheral circuit element. For this reason, it is possible to regulate such a charge from invading to the p-type well region 2a in the pixel region from the peripheral circuit region, and consequently to prevent degradation in the sensitivity.

Additionally, an explanation has been given of a high-concentration impurity region of phosphorus as the gettering layer 61; however, the gettering layer 61 may be an impurity region in which boron is injected at a high concentration. This case also exerts the same gettering effect as phosphorus. In this case, the gettering layer 61 has an impurity concentration (approximately, $10^{18}$ to $10^{19}$ ions/cm$^{-3}$) higher than the impurity concentration (approximately, $10^{17}$ ions/cm$^{-3}$) of the p-type well region 2a.

(Third Embodiment)

The present embodiment relates to a method for forming the gettering layer 61 of FIG. 7 through an ion injection method.

Figure 12:
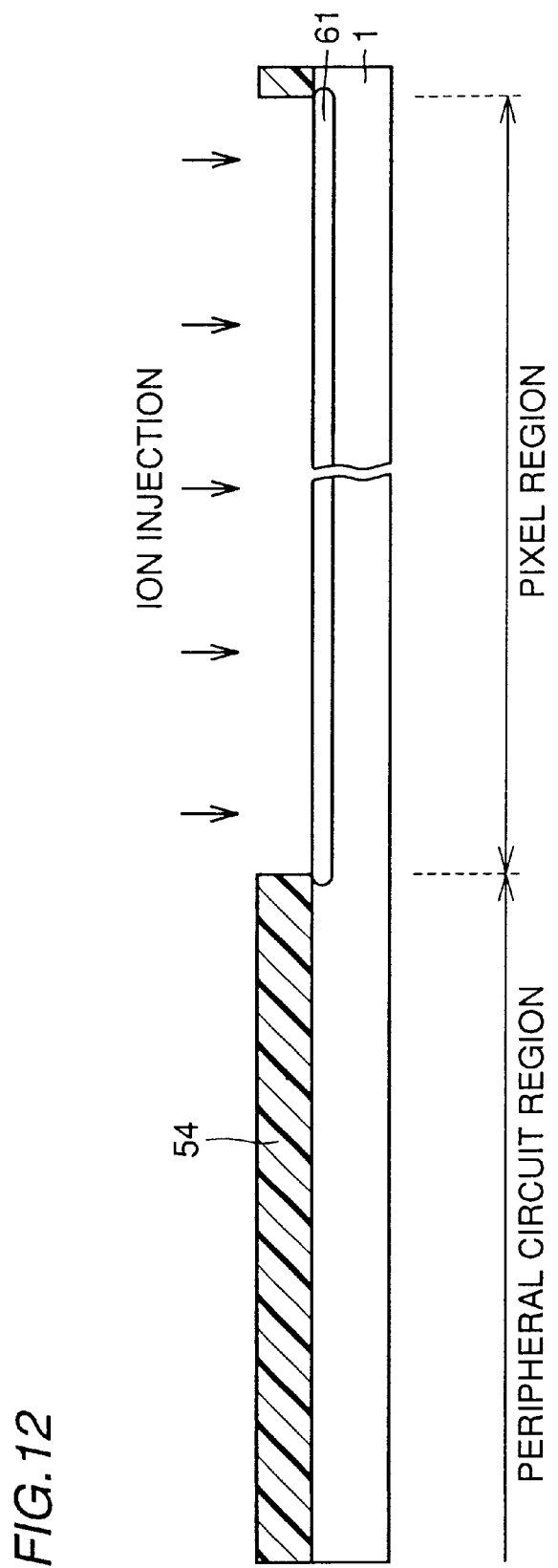
FIG. 12 is a cross-sectional view that schematically shows a manufacturing method of a semiconductor device having a solid state image sensing device in accordance with Third Embodiment of the present invention.

As illustrated in FIG. 12, on an n-type silicon substrate 1a, a resist pattern 54 is formed by using a normal photolithography technique. Phosphorus is ion-injected to the surface of the n-type silicon substrate 1a at energy not more than 100 keV using the resist pattern 54 as a mask. Thus, a gettering layer 61 is formed. Thereafter, the resist pattern 54 is removed, and as shown in FIGS. 10 and 11, the same processes as those of Second Embodiment are carried so that a semiconductor device having a solid state image sensing device as shown in FIG. 7 is completed.

In the present embodiment, since the gettering layer 61 is formed by the ion-injection method, the gettering layer 61 can be formed in a well-controlled manner.

(Fourth Embodiment)

The present embodiment relates to a method for forming the gettering layer 61 of FIG. 7 by using processes different from those of Third Embodiment.

Figure 13:
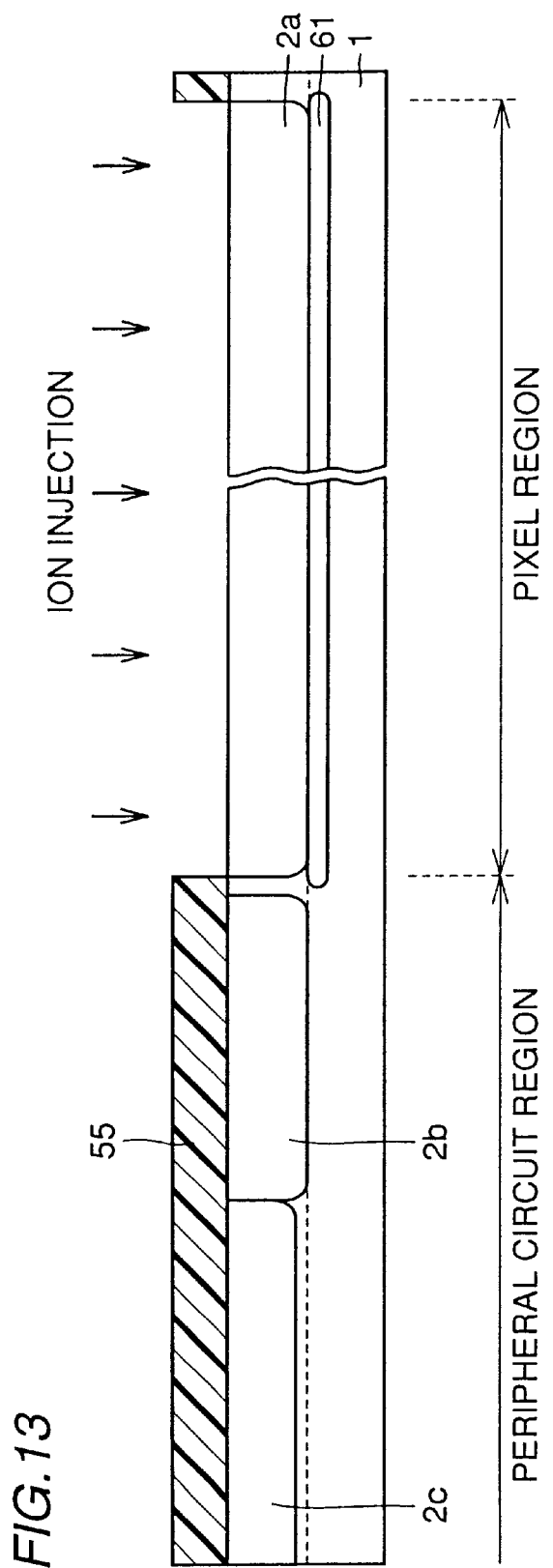
FIG. 13 is a cross-sectional view that schematically shows a manufacturing method of a semiconductor device having a solid state image sensing device in accordance with Fourth Embodiment of the present invention.

In the manufacturing method of the present embodiment, p-type well regions 2a and 2b and an n-type well region 2c are formed through the same processes as those shown in FIGS. 4 and 5. Thereafter, as illustrated in FIG. 13, a resist pattern 55 is formed on the surface of the semiconductor substrate 1 through a normal photolithography technique. For example, phosphorus is ion-injected thereto by using the resist pattern 55 as a mask. In this ion injection, energy is adjusted so that the injection depth is set to the lower portion of the p-type well region 2a. Thus, a gettering layer 61 is formed on the lower side of the p-type well region 2a. Thereafter, the resist pattern 55 is removed, and the same post-processes as those of First to Fourth Embodiments are carried out to complete a semiconductor device having a solid state image sensing device as shown in FIG. 7.

(Fifth Embodiment)

Figure 14:
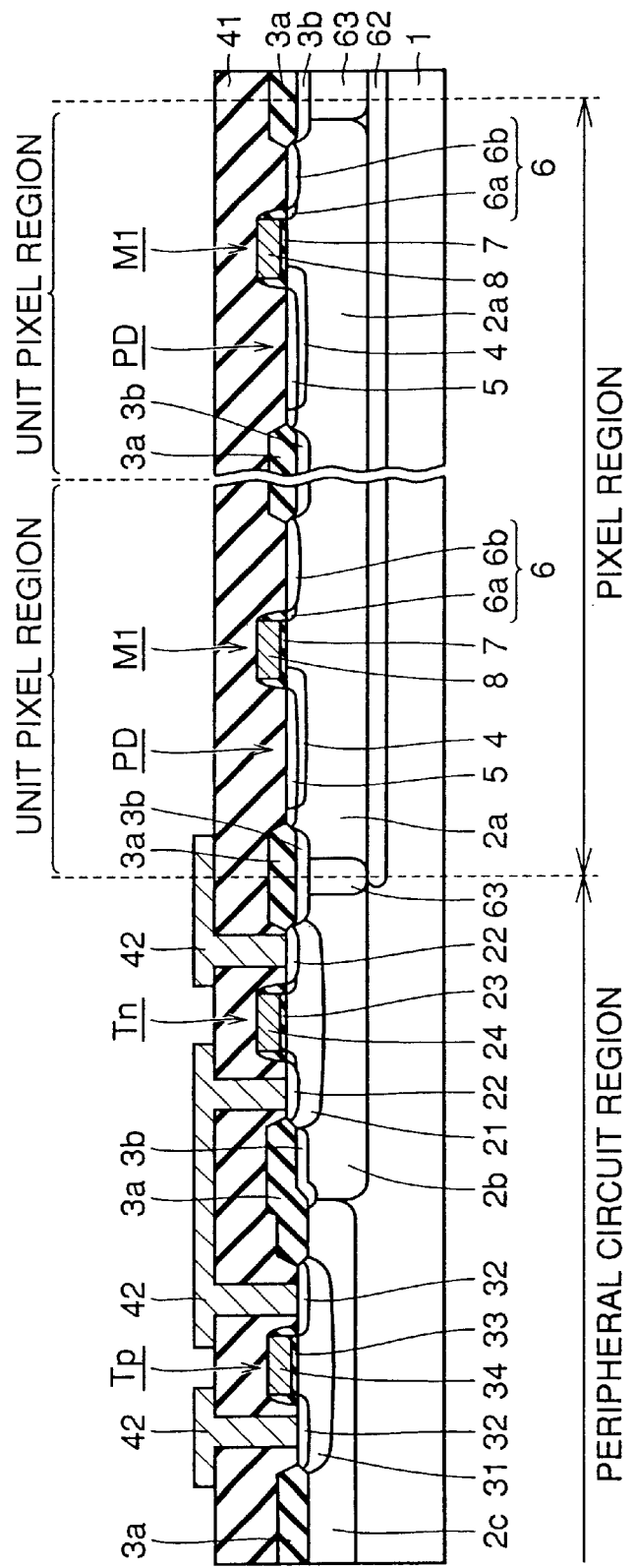
FIG. 14 is a cross-sectional view that schematically shows the structure of a semiconductor device having a solid state image sensing device in accordance with Fifth Embodiment of the present invention.
Figure 15:
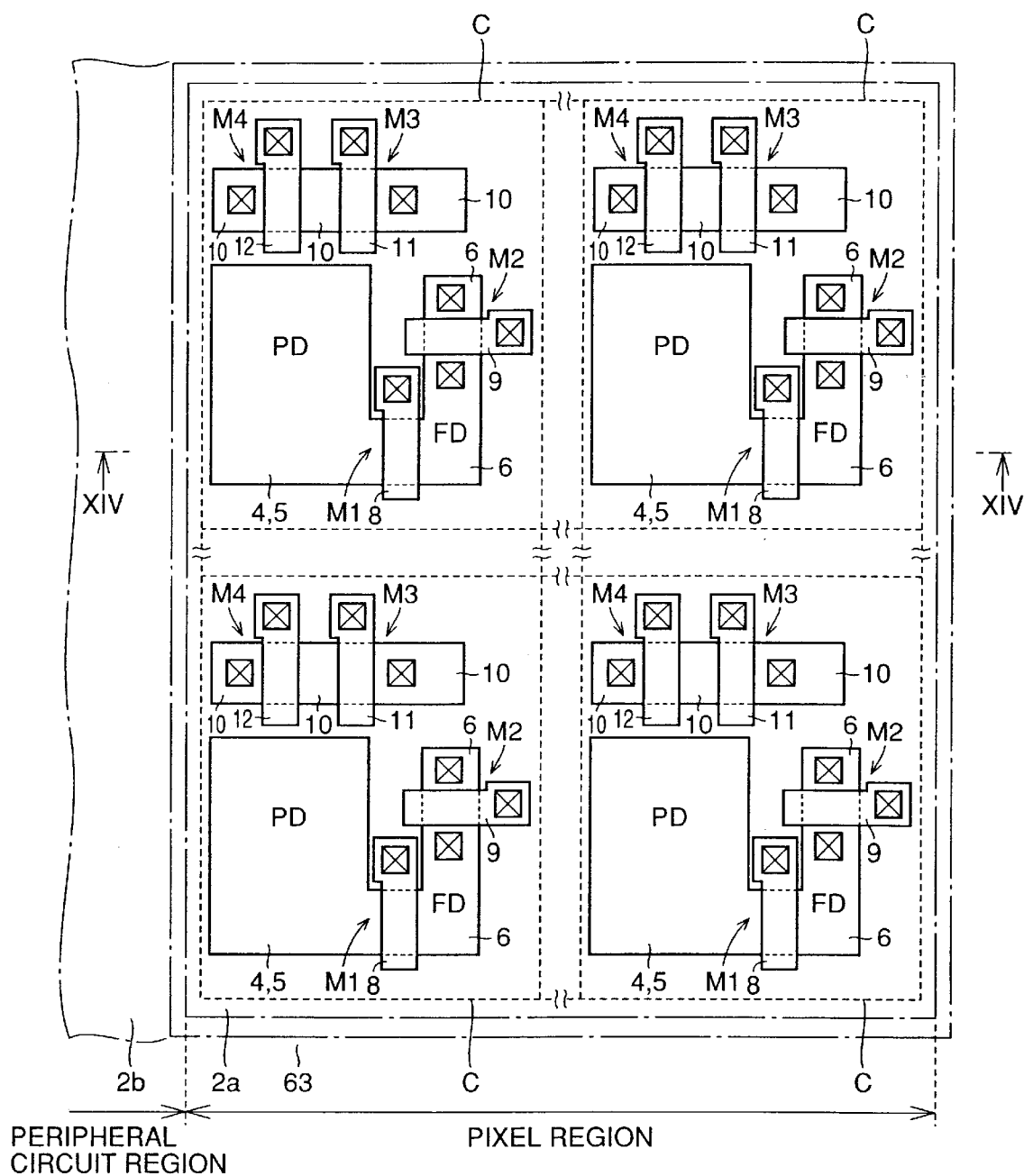
FIG. 15 is a plan view that schematically shows the structure of a semiconductor device having a solid state image sensing device in accordance with Fifth Embodiment of the present invention.

As illustrated in FIG. 14, in comparison with the construction of First Embodiment shown in FIG. 2, the construction of the present embodiment is distinct in that n-type separating high-concentration impurity regions 62 and 63 are added thereto. The separating high-concentration impurity region 62 is formed in a manner so as to contact the lower portion of the p-type well region 2a in the pixel region. Moreover, the separating high-concentration impurity region 63 is formed on the side portion of the p-type well region 2a in a manner so as to surround the p-type well region 2a on the periphery thereof, as shown in FIG. 15. These separating high-concentration impurity regions 62 and 63 are, for example, impurity regions that are doped with phosphorus at a high-concentration of $10^{18}$ to $10^{19}$ cm$^{-3}$.

Here, FIG. 14 is a schematic cross-sectional view taken along line XIV—XIV of FIG. 15. Here, the other construction is virtually the same as the construction of First Embodiment, and the same members are represented by the same reference numbers; and the description thereof will be omitted.

Next, an explanation will be given of a manufacturing method of the semiconductor device having a solid state image sensing device of the present embodiment.

Figure 16:
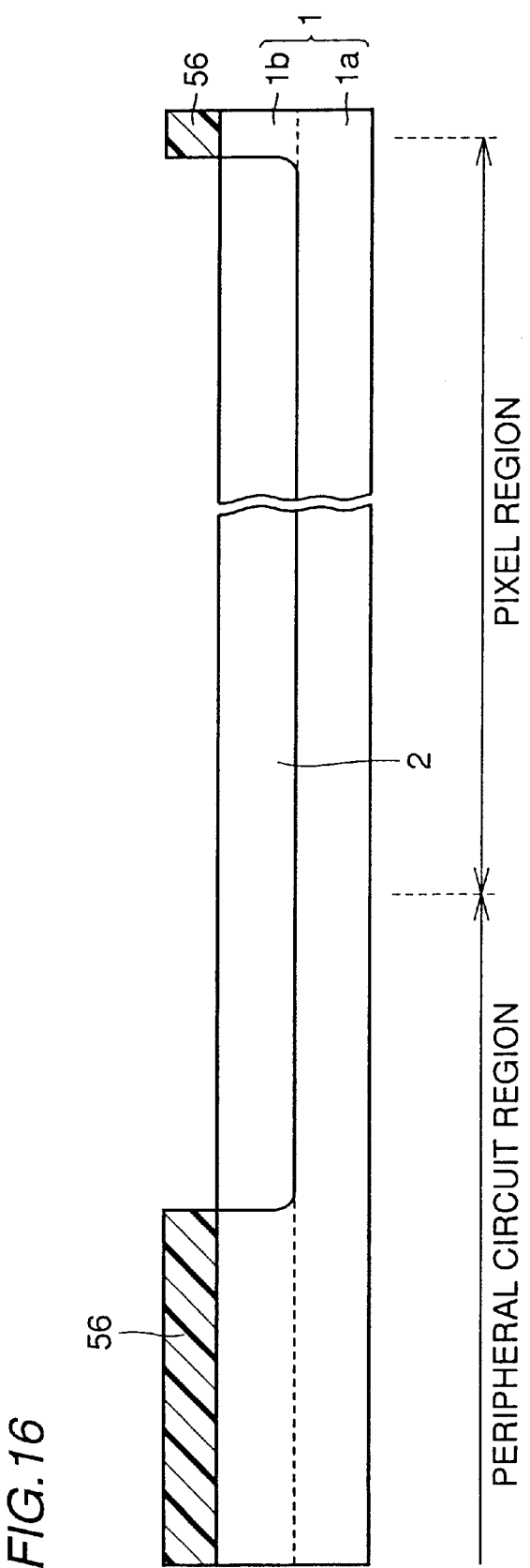
FIGS. 16 to 20 are schematic cross-sectional views that show a sequence of processes of a manufacturing method of the semiconductor device having a solid state image sensing device of Fifth Embodiment of the present invention.

As illustrated in FIG. 16, a silicon single crystal 1b is formed through epitaxial growth on an n-type silicon substrate 1a. On the surface of the semiconductor substrate 1 composed of the n-type silicon substrate 1a and the silicon single crystal 1b, a resist pattern 56 is formed by using a normal photolithography technique. A p-type well region 2 is formed on the entire region of the pixel region and one portion of the peripheral circuit region by an ion injection, etc., by using the resist pattern 56 as a mask. Thereafter, the resist pattern 56 is removed.

Figure 17:
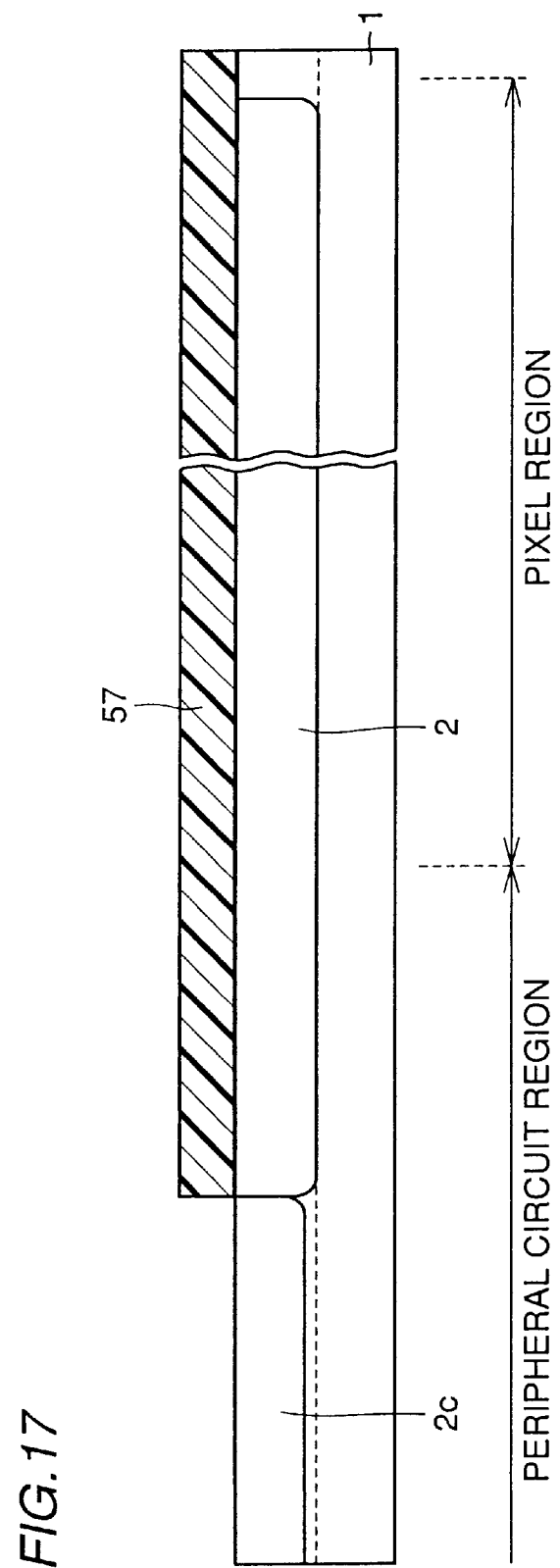

As illustrated in FIG. 17, on the surface of the semiconductor substrate 1, a resist pattern 57 is formed by using a normal photolithography technique. An n-type well region 2c is formed on one portion of the peripheral circuit region of the semiconductor substrate 1 by an ion-injection by using the resist pattern 57 as a mask. Thereafter, the resist pattern 57 is removed.

Figure 18:
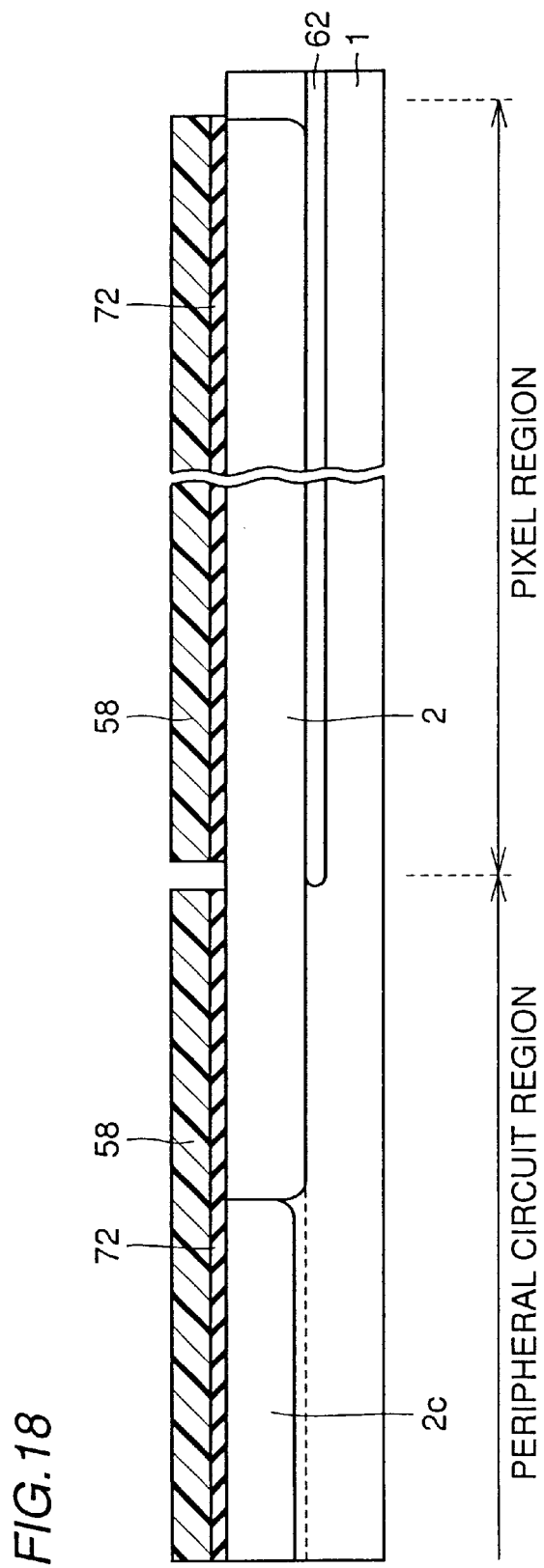

As illustrated in FIG. 18, the same method as the formation method of the gettering layer 61 of Fourth Embodiment is carried out to form an n-type separating high-concentration impurity region 62. Here, the separating high-concentration impurity region 62 may be formed by using the same method as the formation method of the gettering layer 61 of Second and Third Embodiments. Then, a silicon oxide film 72 is formed on the semiconductor substrate 1 with a thickness of 100 nm. A resist pattern 58 is formed on the silicon oxide film 72 by using a normal photolithography technique. The silicon oxide film 72 is etched and patterned by using the resist pattern 58 as a mask. Thereafter, the resist pattern 58 is removed.

Figure 19:
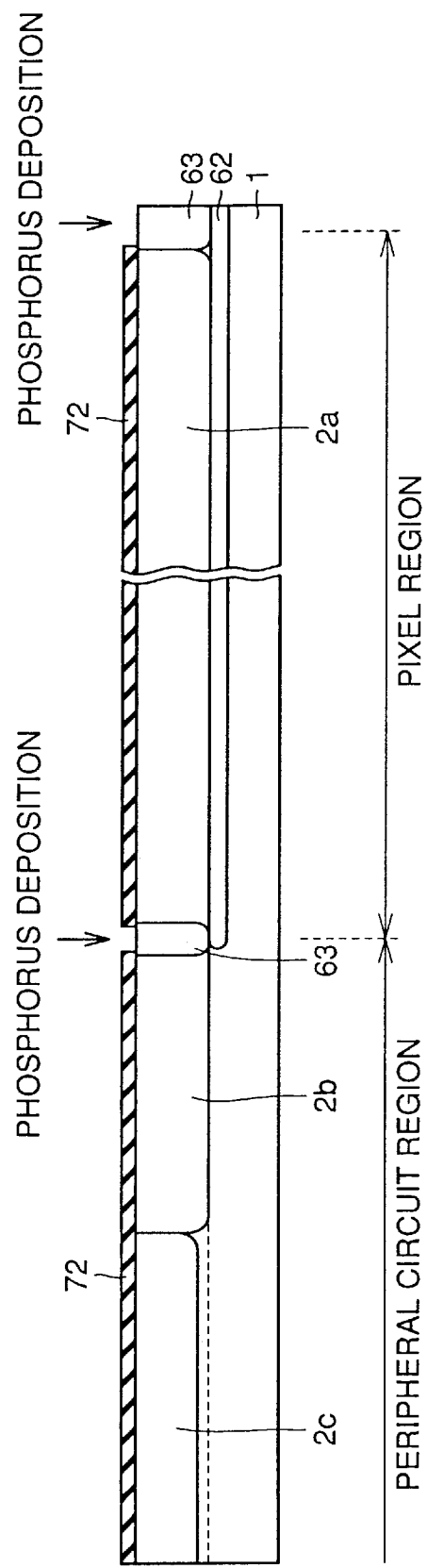

As illustrated in FIG. 19, the semiconductor substrate 1 is exposed to a gaseous atmosphere in which, for example, a gas such as $POCl_3$ is thermally decomposed at a temperature of approximately 850 to 900° C. Thus, phosphorus is deposited on the surface exposed from the silicon oxide film 72 of the semiconductor substrate 1 so that an n-type separating high-concentration impurity region 63 that is a dispersed region of phosphorus is formed in a manner so as to surround the pixel region. Thus, the p-type well region 2 is separated into the p-type well regions 2a and 2b. Thereafter, the silicon oxide film 72 is removed.

Figure 20:
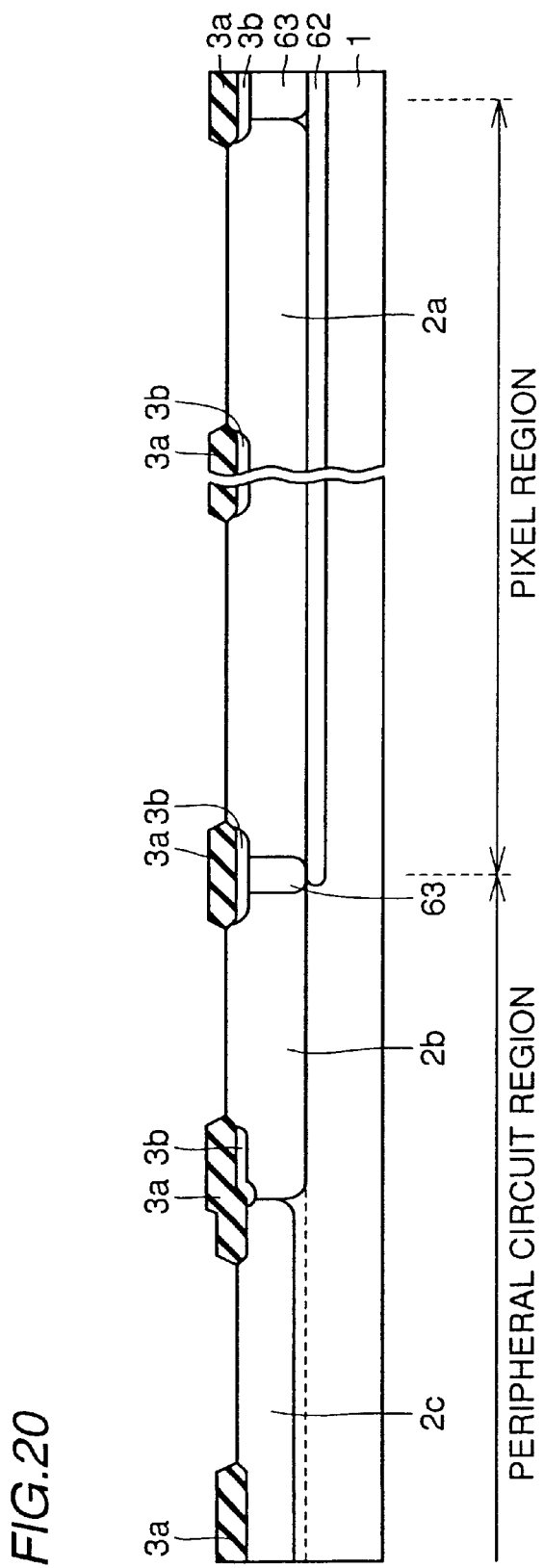

As illustrated in FIG. 20, a field oxide film 3a is selectively formed on the surface of the semiconductor substrate 1 through a normal LOCOS method, and a separating $p^+$ impurity region 3b is formed in a manner so as to contact the lower face of the field oxide film 3a. Then, a solid state image sensing device, peripheral circuit element, etc. are formed so that a semiconductor device having a solid state image sensing device, shown in FIG. 14, is completed.

In the present embodiment, the separating high-concentration impurity region 63 is formed in a manner so as to surround the side portion of the p-type well region 2a within the pixel region. For this reason, it is possible to prevent a charge such as a hot carrier, transition metals, etc. in the peripheral circuit region from invading the p-type well region 2a in the pixel region. Thus, it becomes possible to reduce leak currents, to prevent degradation in the sensitivity, and also to improve resistance to latch-up.

Moreover, since the high-concentration impurity region 63 is formed between the p-type well regions 2a and 2b, it is possible to narrow the gap between the p-type well regions 2a and 2b, and consequently to improve the degree of integrity.

Furthermore, the separating high-concentration impurity region 62 is formed on the lower portion of the p-type well region 2a within the pixel region; therefore, in the same manner as the formation of the gettering layer of Second Embodiment, the gettering effect makes it possible to reduce leak currents, to regulate latch-up generation, and also to prevent degradation in the sensitivity.

(Sixth Embodiment)

The present embodiment relates to a method for forming the separating high-concentration impurity region 63 shown in FIG. 14 by using an ion-injection method.

Figure 21:
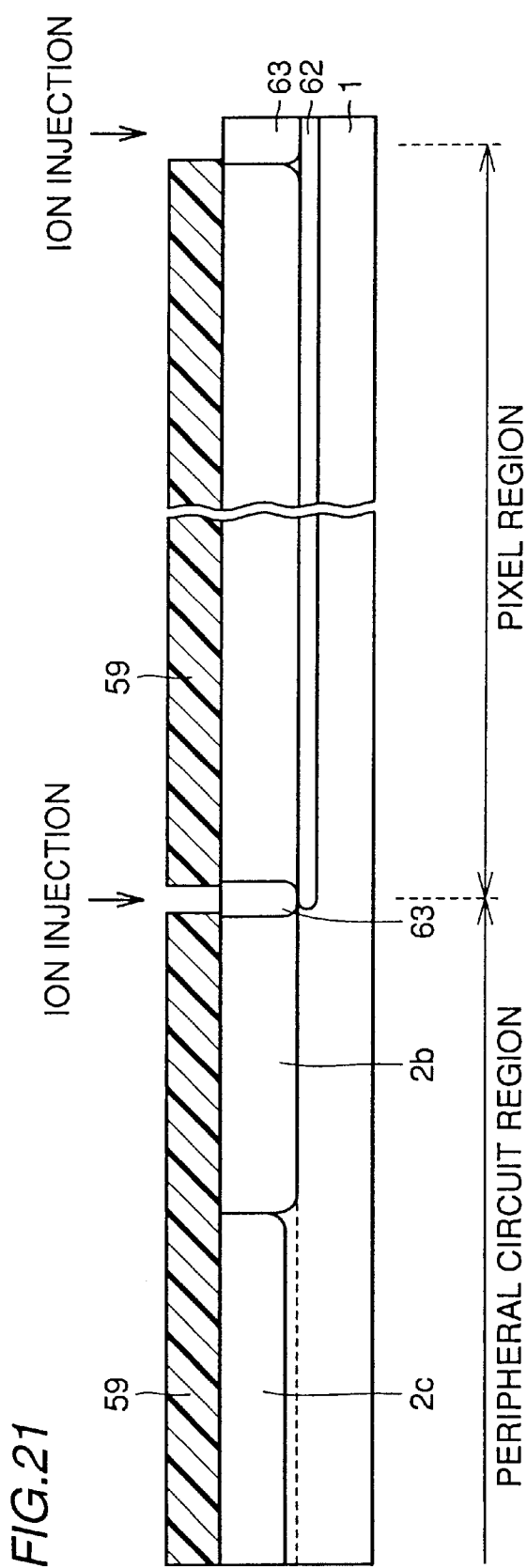
FIG. 21 is a cross-sectional view that schematically shows a manufacturing method of a semiconductor device having a solid state image sensing device in accordance with Sixth Embodiment of the present invention.
Figure 22:
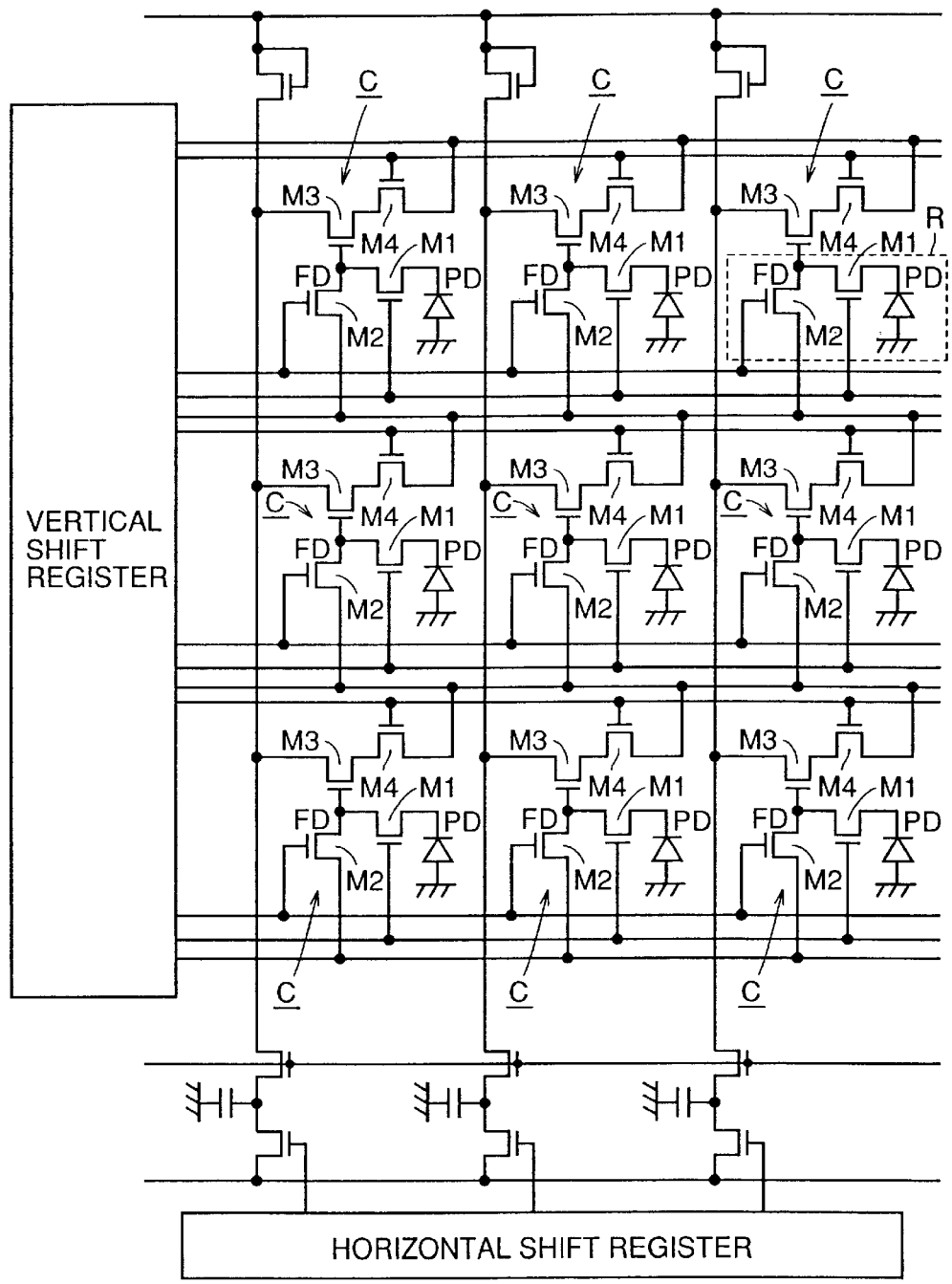
FIG. 22 is a drawing that shows a circuit construction of an image sensor of the CMOS type.
Figure 23:
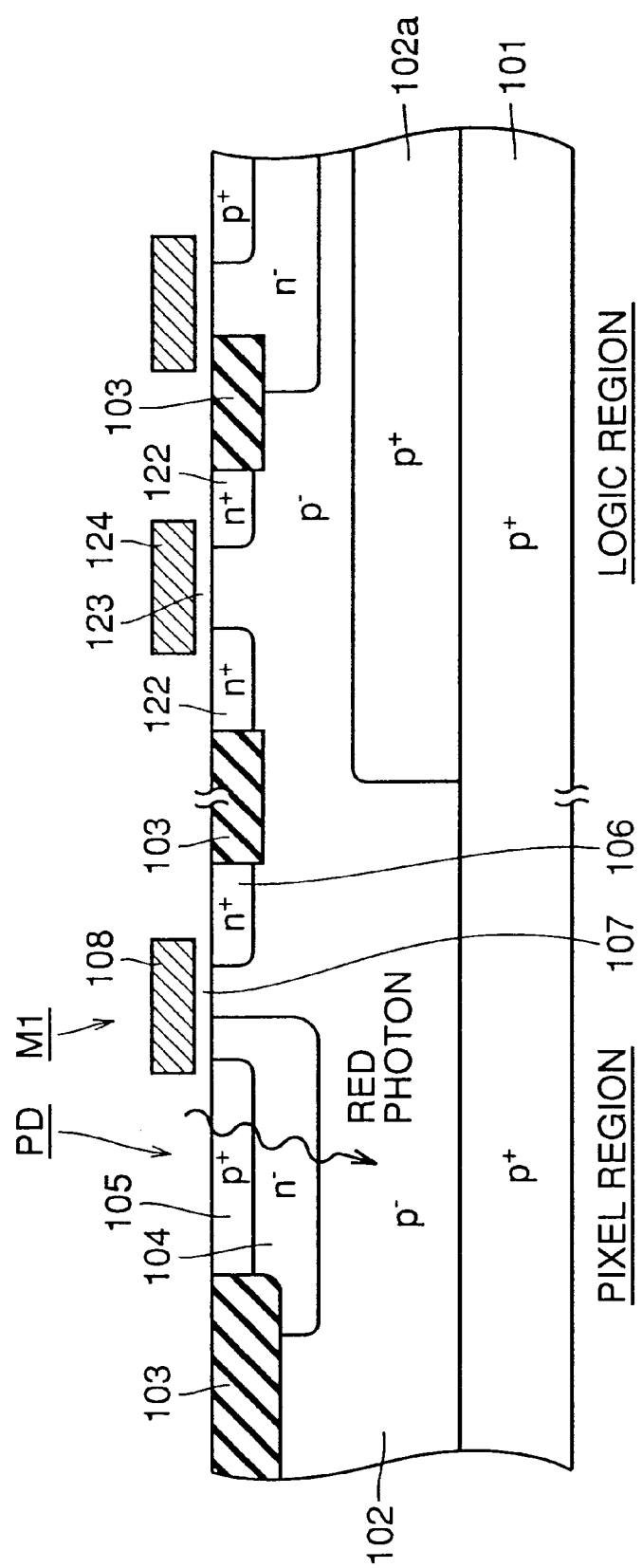
FIG. 23 is a cross-sectional view that schematically shows the structure of a semiconductor device having a solid state image sensing device that is disclosed in U.S. Pat. No. 5,898,196.

In the manufacturing method of the present embodiment, first, the same processes as those of Fifth Embodiment as shown in FIGS. 16 and 17 are carried out. As illustrated in FIG. 21, an n-type separating high-concentration impurity region 62 is formed by using the same method as the formation method of the gettering layer 61 of Fourth Embodiment. The separating high-concentration impurity region 62 may be formed by using the same method as the formation method of the gettering layer 61 of Second and Third Embodiments. Then, a resist pattern 59 is formed on the surface of the semiconductor substrate 1 by using a normal photolithography technique. A separating high-concentration impurity region 63 is formed in a manner so as to surround the p-type well region 2a in the pixel region on the periphery thereof by injecting, for example, phosphorus by using the resist pattern 59 as a mask.

Thereafter, the same post-treatment processes as Fifth Embodiment are carried out to complete a semiconductor device having a solid state image sensing device as shown in FIG. 14.

In the present embodiment, the application of the ion-injection method makes it possible to form the separating high-concentration impurity region 63 in a well-controlled manner.

Although the present invention has been described and illustrated in detail, it is clearly understood that the same is by way of limitation and example only and is not to be taken by way of limitation, the spirit and scope of the present invention being limited only by the terms of the appended claims.

What is claimed is:

1. A semiconductor device having a solid state image sensing device comprising:

a semiconductor substrate of a first conductive type, having a main surface;

first and second well regions of a second conductive type, formed on the main surface of said semiconductor substrate;

a plurality of unit cells each of which is formed on said first well region, and is provided with a photoelectric transfer element for transferring light to an electric signal; and a peripheral circuit element, formed on said second well region, for controlling a plurality of said unit cells, wherein said first well region is surrounded by a region of the first conductive type on the periphery thereof so as to be separated from said second well region.

2. The semiconductor device having a solid state image sensing device according to claim 1, wherein a gettering layer is formed below said first well region.

3. The semiconductor device having a solid state image sensing device according to claim 2, wherein said gettering layer is of the first conductive type, and has an impurity concentration higher than an impurity concentration of said semiconductor substrate.

4. The semiconductor device having a solid state image sensing device according to claim 2, wherein said gettering layer is of the second conductive type, and has an impurity concentration higher than an impurity concentration of said first well region.

5. The semiconductor device having a solid state image sensing device according to claim 1, further comprising:

a first separating impurity region of the first conductive type, which surrounds a side portion of said first well region, and has an impurity concentration higher than an impurity concentration of the semiconductor substrate.

6. The semiconductor device having a solid state image sensing device according to claim 5, further comprising:

a second separating impurity region of the first conductive type, which is formed below said first well region, and has an impurity concentration higher than the impurity concentration of said semiconductor substrate.

* * * * *